(12) United States Patent
Lee

(10) Patent No.: US 11,451,216 B1
(45) Date of Patent: Sep. 20, 2022

(54) POWER ON AND POWER DOWN RESET CIRCUIT

(71) Applicant: Advanced Analog Technology, Inc., Zhubei (TW)

(72) Inventor: Kun-Hsu Lee, Zhubei (TW)

(73) Assignee: ADVANCED ANALOG TECHNOLOGY, INC., Zhubei (TW)

( * ) Notice: Subject to any disclaimer, the term of this patent is extended or adjusted under 35 U.S.C. 154(b) by 0 days.

(21) Appl. No.: 17/520,320

(22) Filed: Nov. 5, 2021

(30) Foreign Application Priority Data

Sep. 6, 2021 (TW) .................................. 110133046

(51) Int. Cl.
| H03K 5/22 | (2006.01) |
| H03K 3/012 | (2006.01) |
| H03K 17/687 | (2006.01) |
| H03K 5/24 | (2006.01) |

(52) U.S. Cl.
CPC ............... *H03K 3/012* (2013.01); *H03K 5/24* (2013.01); *H03K 17/6872* (2013.01)

(58) Field of Classification Search
CPC ............ H03K 3/01; H03K 3/012; H03K 5/08; H03K 5/082; H03K 5/22; H03K 5/24; H03K 5/2472; H03K 5/2481; H03K 17/22; H03K 17/223; H03K 17/687; H03K 17/6871; H03K 17/6872; G06F 1/24
See application file for complete search history.

(56) References Cited

U.S. PATENT DOCUMENTS

| 5,852,376 A * | 12/1998 | Kraus | .................. | H03K 17/223 |
| | | | | 327/143 |
| 8,330,526 B2 * | 12/2012 | Vilas Boas | ............... | G06F 1/28 |
| | | | | 327/83 |

* cited by examiner

*Primary Examiner* — Long Nguyen
(74) *Attorney, Agent, or Firm* — Muncy, Geissler, Olds & Lowe, P.C.

(57) ABSTRACT

A power on and power down reset circuit includes a reference voltage generation module, a monitoring voltage generation module, and a voltage comparator. The reference voltage generation module is utilized to generate a reference voltage with a first PMOS transistor, a second PMOS transistor, a third PMOS transistor, a first NMOS transistor, a second NMOS transistor, a third NMOS transistor, a first resistance, and a second resistance. The monitoring voltage generation module is utilized to generate a monitoring voltage. The voltage comparator is utilized to generate a reset voltage by comparing the reference voltage to the monitoring voltage. Thus, the power on and power down reset circuit can achieve the effect of power savings and decreasing error rate of the reset voltage.

6 Claims, 4 Drawing Sheets

POWER ON AND POWER DOWN RESET CIRCUIT

This application claims the benefit of Taiwan Patent Application Serial No. 110133046, filed Sep. 6, 2021, the subject matter of which is incorporated herein by reference.

BACKGROUND OF THE INVENTION (1) Field of the Invention

The invention relates to a circuit, and more particularly to a power on and power down reset circuit.

(2) Description of the Prior Art

Generally speaking, when a system is powered on, all the devices thereof would be simultaneously reset. Then, the CPU (Central processing unit) can communicate with all these initialized devices.

Referring to FIG. 1, a conventional reset circuit is shown. In this example, a reset circuit PA1 includes a reference voltage generation module PA11, a monitoring voltage generation module PA12 and a comparator PA13. The reset circuit PA1 is used for receiving an input voltage VDD, and then generates a corresponding reset voltage RST.

The reference voltage generation module PA11, used for receiving the input voltage VDD and generating accordingly a reference voltage, includes a first PMOS transistor PAP1, a second PMOS transistor PAP2, a first NMOS transistor PAN1, a second NMOS transistor PAN2 and a resistor PAR. The monitoring voltage generation module PA12, used for receiving the input voltage VDD and generating accordingly a monitoring voltage, includes a third PMOS transistor PAP3, a fourth PMOS transistor PAP4, a third NMOS transistor PAN3 and a fourth NMOS transistor PAN4.

The comparator PA13, electrically connected with the reference voltage generation module PA11 and the monitoring voltage generation module PA12, has a first voltage-input end V− and a second voltage-input end V+. The first voltage-input end V− is to receive the monitoring voltage, and the second voltage-input end V+ is to receive the reference voltage. The comparator PA13 would compare the reference voltage to the monitoring voltage so as to generate the reset voltage RST. In the aforesaid description, all the VDD, RST, V+ and V− are well known to the skill in the art, and thus details about any of the input voltage VDD, the first voltage-input end V−, the second voltage-input end V+, and the reset voltage RST would be omitted herein.

Nevertheless, since the conventional reset circuit PA1 would present problems in excessive energy consumption and insufficient voltage concentration in some temperature ranges (elucidated in following sections), thus an improvement upon the conventional reset circuit is necessary.

SUMMARY OF THE INVENTION

In view that the conventional reset circuit may present shortcomings in energy consumption and voltage concentration while being operated within some specific temperature ranges, accordingly it is an object of the present invention to provide a power on and power down reset circuit for resolving at least one of the aforesaid shortcomings.

In this invention, a power on and power down reset circuit is applied for receiving an input voltage input from an input-voltage end to further accordingly generate a reset voltage, and includes a reference voltage generation module, a monitoring voltage generation module and a comparator. The reference voltage generation module, electrically connected with the input-voltage end and configured for receiving the input voltage to generate correspondingly a reference voltage, includes a first PMOS transistor, a second PMOS transistor, a third PMOS transistor, a first NMOS transistor, a second NMOS transistor, a third NMOS transistor, a first resistor and a second resistor.

The first PMOS transistor has a first source, a first drain and a first gate, in which the first source is to receive the input voltage. The second PMOS transistor has a second source, a second drain and a second gate, in which the second drain is electrically serially connected with the first gate of the first PMOS transistor, and the second source is to receive the input voltage. The third PMOS transistor has a third source, a third drain and a third gate, in which the third gate is electrically serially connected with the second gate, and the third source is to receive the input voltage. The first NMOS transistor has a sixth source, a sixth drain and a sixth gate, in which the sixth drain is electrically serially connected with the first drain of the first PMOS transistor, and the sixth gate is electrically serially connected with the first drain. The second NMOS transistor has a seventh source, a seventh drain and a seventh gate, in which the seventh drain is electrically serially connected with the second drain. The third NMOS transistor has an eighth source, an eighth drain and an eighth gate, in which the eighth gate is electrically serially connected with the seventh gate, and the eighth drain is electrically serially connected with the third drain. The first resistor is electrically serially connected with the sixth source of the first NMOS transistor and the seventh drain of the second NMOS transistor. The second resistor is electrically serially connected with the first resistor.

The monitoring voltage generation module, electrically connected with the input-voltage end, is configured for receiving the input voltage to generate correspondingly a monitoring voltage. The comparator, having a first voltage-input end and a second voltage-input end and electrically connected with the reference voltage generation module and the monitoring voltage generation module, is to receive the monitoring voltage and the reference voltage for generating accordingly the reset voltage.

In one embodiment of the present invention, the monitoring voltage generation module includes a fourth PMOS transistor, a fifth PMOS transistor, a fourth NMOS transistor and a fifth NMOS transistor. The fourth PMOS transistor has a fourth source, a fourth drain and a fourth gate, in which the fourth source is to receive the input voltage. The fifth PMOS transistor has a fifth source, a fifth drain and a fifth gate. The fourth NMOS transistor has a ninth source, a ninth drain and a ninth gate, in which the ninth drain is electrically serially connected with the fourth drain. The fifth NMOS transistor has a tenth source, a tenth drain and a tenth gate, in which the tenth gate is electrically serially connected with the ninth gate, and the tenth drain is electrically serially connected with the fifth drain.

In one embodiment of the present invention, the third drain of the third PMOS transistor is electrically connected to the eighth drain of the third NMOS transistor to form a node in between, and the node is further serially connected with the comparator for generating the reference voltage.

In one embodiment of the present invention, the first drain of the first PMOS transistor, the sixth drain of the first NMOS transistor, and the sixth source of the first NMOS transistor are electrically connected to form a node, and the node is serially connected with the comparator for generating accordingly the reference voltage.

In one embodiment of the present invention, when the monitoring voltage is greater than the reference voltage, the reset voltage generated at the comparator is 0.

In one embodiment of the present invention, when the monitoring voltage is less than the reference voltage, the reset voltage generated at the comparator is equal to the input voltage.

As stated, the power on and power down reset circuit provided in this invention utilizes the first PMOS transistor, the first NMOS transistor, the first resistor and the second resistor are integrated to perform the temperature compensation. Thus, in comparison with the prior art, based on experimental data, the power on and power down reset circuit of this invention can perform much better in achieving the power saving and lowering the entire tolerance rate of the reset voltage.

All these objects are achieved by the power on and power down reset circuit described below.

BRIEF DESCRIPTION OF THE DRAWINGS

The present invention will now be specified with reference to its preferred embodiment illustrated in the drawings, in which.

DESCRIPTION OF THE PREFERRED EMBODIMENT

The invention disclosed herein is directed to a power on and power down reset circuit. In the following description, numerous details are set forth in order to provide a thorough understanding of the present invention. It will be appreciated by one skilled in the art that variations of these specific details are possible while still achieving the results of the present invention. In other instance, well-known components are not described in detail in order not to unnecessarily obscure the present invention.

Figure 1:
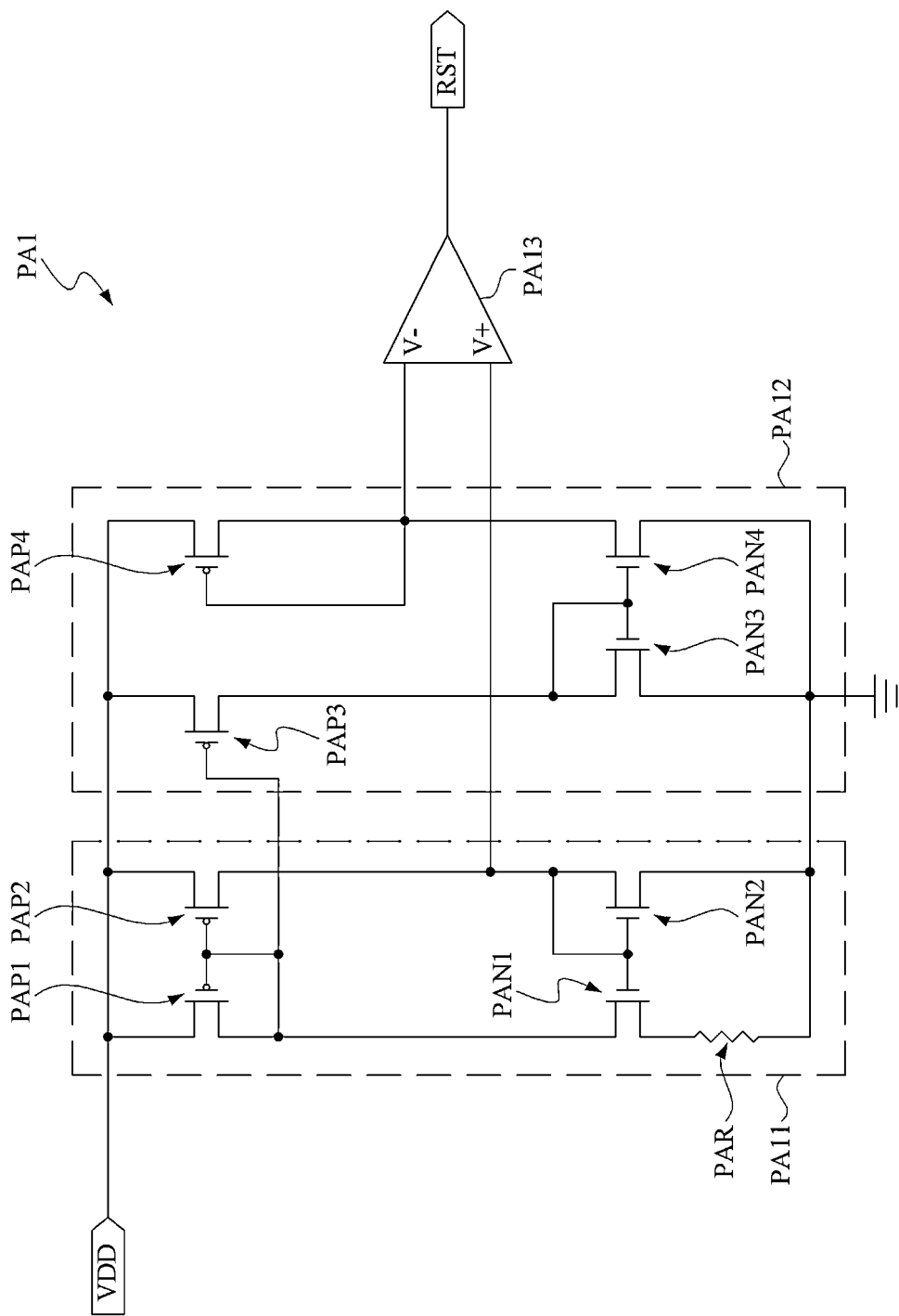
FIG. 1 is a schematic view of a conventional reset circuit.
Figure 2:
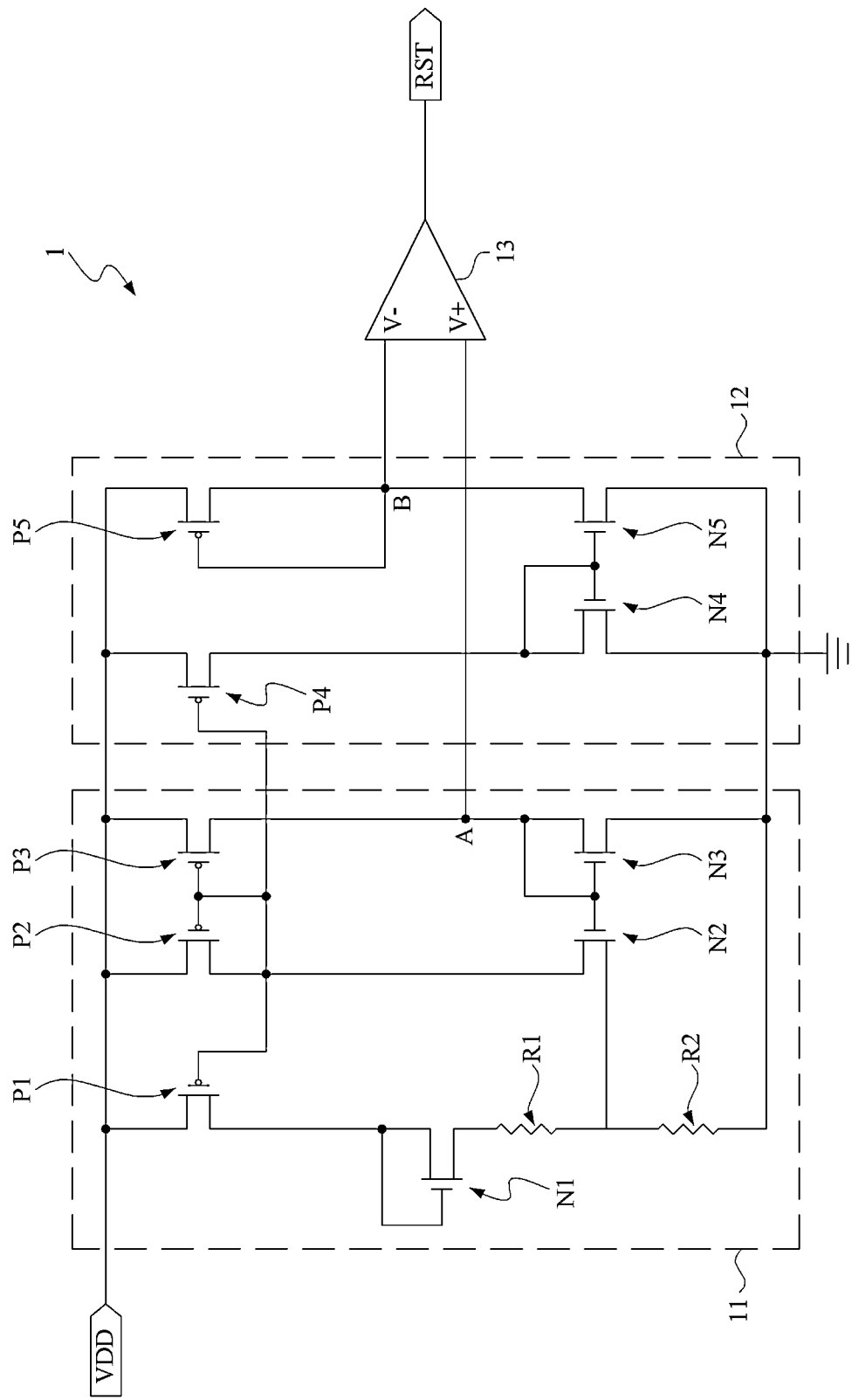
FIG. 2 is a schematic view of a first embodiment of the power on and power down reset circuit in accordance with the present invention.
Figure 3:
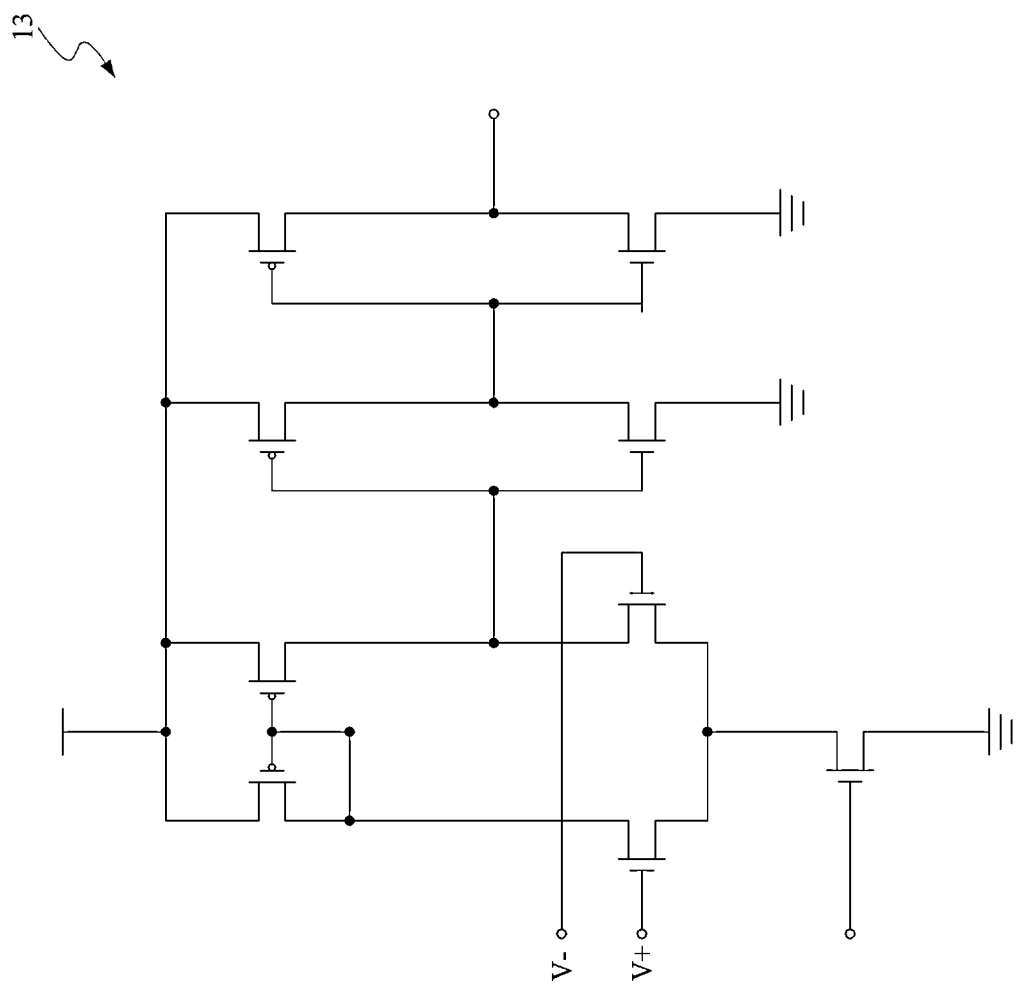
FIG. 3 demonstrates schematically a circuit structure of the comparator of FIG. 2.

Refer to FIG. 2 and FIG. 3; where FIG. 2 is a schematic view of a first embodiment of the power on and power down reset circuit in accordance with the present invention, and FIG. 3 demonstrates schematically a circuit structure of the comparator of FIG. 2. As shown, in the first embodiment, the power on and power down reset circuit 1, configured to receive an input voltage VDD input from an input-voltage end so as thereby to produce a reset voltage RST, includes a reference voltage generation module 11, a monitoring voltage generation module 12 and a comparator 13.

The reference voltage generation module 11, electrically connected with the input-voltage end and configured to receive the input voltage VDD for generating a reference voltage, includes a first PMOS transistor P1, a second PMOS transistor P2, a third PMOS transistor P3, a first NMOS transistor N1, a second NMOS transistor N2, a third NMOS transistor N3, a first resistor R1 and a second resistor R2.

The monitoring voltage generation module 12, electrically also connected with the input-voltage end and configured to receive the input voltage VDD for generating a monitoring voltage, includes a fourth PMOS transistor P4, a fifth PMOS transistor P5, a fourth NMOS transistor N4 and a fifth NMOS transistor N5.

The comparator 13 has a first voltage-input end V− and a second voltage-input end V+, is electrically connected with the monitoring voltage generation module 12 and the reference voltage generation module 11, and is to receive the monitoring voltage and the reference voltage, respectively, so as to generate the reset voltage RST.

In the following description, details of circuit components of this first embodiment will be elucidated.

The first PMOS transistor P1 has a first source, a first drain and a first gate, in which the first source is to receive input the voltage VDD.

The second PMOS transistor P2 has a second source, a second drain and a second gate, in which the second drain is electrically serially connected with the first gate of the first PMOS transistor P1, and the second source is to receive the input voltage VDD.

The third PMOS transistor P3 has a third source, a third drain and a third gate, in which the third gate is electrically serially connected with the second gate, and the third source is to receive the input voltage VDD.

The fourth PMOS transistor P4 has a fourth source, a fourth drain and a fourth gate, in which the fourth source is to receive the input voltage VDD, and the fourth gate is electrically serially connected with the first gate.

The fifth PMOS transistor P5 has a fifth source, a fifth drain and a fifth gate, in which the fifth source is to receive the input voltage VDD, and the fifth gate is electrically serially connected with the fifth drain.

The first NMOS transistor N1 has a sixth source, a sixth drain and a sixth gate, in which the sixth drain is electrically serially connected with the first drain of the first PMOS transistor P1, and the sixth gate is electrically serially connected with the first drain.

The second NMOS transistor N2 has a seventh source, a seventh drain and a seventh gate, in which the seventh drain is electrically serially connected with the second drain.

The third NMOS transistor N3 has an eighth source, an eighth drain and an eighth gate, in which the eighth gate is electrically serially connected with the seventh gate, the eighth drain is electrically serially connected with the third drain, and the eighth source is grounded. As shown, a node A is formed between the eighth drain and the third drain, further electrically serially connected with the comparator 13, and to generate a reference voltage to the second voltage-input end V+.

The fourth NMOS transistor N4 has a ninth source, a ninth drain and a ninth gate, in which the ninth drain is electrically serially connected with the fourth drain, ninth gate is electrically serially connected with the fourth drain, and the ninth source is grounded.

The fifth NMOS transistor N5 has a tenth source, a tenth drain and a tenth gate, in which the tenth gate is electrically serially connected with the ninth gate, the tenth drain is electrically serially connected with the fifth drain, and the tenth source is grounded. As shown, a node B is formed among the tenth drain, the fifth drain and the fifth gate, electrically serially connected with the comparator 13, and to generate a monitoring voltage to the first voltage-input end V−. In this embodiment, all the aforesaid NMOS transistors are operated in the sub-threshold mode or a weak inversion mode. In other words, the current flowing therethrough is pretty small, and thus the object of power saving can be obtained even that the occupied area is comparatively small.

The first resistor R1 is electrically serially connected with the sixth source of the first NMOS transistor N1 and the seventh drain of the second NMOS transistor N2.

The second resistor R2, serially connected with the first resistor R1, is ten grounded at an opposite end thereof. It shall be explained that total resistance of the first resistor R1 and the second resistor R2 would be equal to the resistance of the aforesaid resistor PAR of the foregoing background section. Thus, the total occupied area by the first resistor R1 and the second resistor R2 would be roughly equal to that by the resistor PAR.

The major difference between the power on and power down reset circuit 1 of the present invention and the aforesaid conventional reset circuit PA1 is that the reference voltage generation module 11 of this invention further includes the first PMOS transistor P1, the first NMOS transistor N1, the first resistor R1 and the second resistor R2. The first PMOS transistor P1, the first NMOS transistor N1, the first resistor R1 and the second resistor R2 are integrated to perform temperature compensation, and may affect a voltage at the first gate of the first PMOS transistor P1, such that the reference voltage can be adjusted. Generally speaking, any of the aforesaid components of the reference voltage generation module 11 would somehow influence the reference voltage.

In the case that the monitoring voltage is greater than the reference voltage, the comparator 13 would generate a zero for the reset voltage RST. On the other hand, if the monitoring voltage is less than the reference voltage, the reset voltage RST generated at the comparator 13 would be equal to the aforesaid input voltage VDD. Thus, a power on reset is feasible while the input voltage VDD is gradually increased. Also, a power down reset is still feasible while the input voltage VDD is gradually decreased. Namely, while in resetting, the input voltage VDD can be differently defined, such as 2V, 2.2V, or 2.4V. In particular, though the comparator 13 of this embodiment is structured to the circuit shown in FIG. 3, yet the comparator of this invention is not limited thereto.

In an experiment, performance of the first embodiment of the power on and power down reset circuit 1 provided by this invention is compared to that of the conventional reset circuit PA1. The analysis of energy consumption for different temperatures is shown in Table 1 and Table 2 as follows. The experimental results of the conventional reset circuit PA1 is shown in Table 1, while those of the first embodiment of the power on and power down reset circuit 1 is shown in Table 2.

TABLE 1

| | Temperature (° C.) | TT | FF | FS | SF | SS |
|---|---|---|---|---|---|---|
| Current (μA) | −40 | 0.46 | 0.93 | 0.47 | 0.46 | 0.31 |
| | 15 | 0.58 | 1.18 | 0.58 | 0.57 | 0.38 |
| | 75 | 0.72 | 1.47 | 0.72 | 0.71 | 0.48 |

TABLE 2

| | Temperature (° C.) | TT | FF | FS | SF | SS |
|---|---|---|---|---|---|---|
| Current (μA) | −40 | 0.41 | 0.83 | 0.41 | 0.40 | 0.27 |
| | 15 | 0.49 | 1.01 | 0.50 | 0.49 | 0.33 |
| | 75 | 0.61 | 1.23 | 0.62 | 0.61 | 0.41 |

It shall be explained that TT, FF, FS, SF, SS in the tables stand for different process corners of the MOS transistor, in which FF stands for a fast NMOS transistor and a fast PMOS transistor, FS stands for a fast NMOS transistor and a slow PMOS transistor, SF stands for a slow NMOS transistor and a fast PMOS transistor, SS stands for a slow NMOS transistor and a slow PMOS transistor, and TT stand for centers (i.e., a typical NMOS transistor and a typical PMOS transistor). Namely, "T" stands for "Typical", and a typical transistor implies that its drive current is an average; "F" stands for "Fast", and a fast transistor implies that its drive current is the maximum; and "S" stands for "Slow", and a slow transistor implies that its drive current is the minimum.

In the foregoing tables, no matter what the temperature or process corner is, the current of this embodiment is always smaller than that of the conventional design. It implies that the power on and power down reset circuit of the first embodiment provided in this disclosure can consume less energy; i.e., a power-saving design. Regarding the power-saving manifold, results in Table 1 and Table 2 are further sorted to present Table 3 as follows for demonstrating the energy saving in a more direct manner.

TABLE 3

| | Temperature (° C.) | TT | FF | FS | SF | SS |
|---|---|---|---|---|---|---|
| Power saving % | −40 | 13.71% | 12.50% | 14.24% | 14.62% | 14.73% |
| | 15 | 17.24% | 17.21% | 16.20% | 17.88% | 16.76% |
| | 75 | 17.62% | 19.18% | 17.47% | 17.64% | 16.31% |

In addition, to different temperatures, analysis results upon the reset voltage RST are listed in Table 4 and Table 5 as follows. Table 4 demonstrates experimental results of the conventional reset circuit PA1, and Table 5 demonstrates experimental results of the first embodiment of the power on and power down reset circuit 1 provided by this invention.

TABLE 4

| | Temperature (° C.) | TT | FF | FS | SF | SS |
|---|---|---|---|---|---|---|
| Reset voltage RST (V) | −40 | 2.30 | 2.23 | 2.24 | 2.37 | 2.46 |
| | 15 | 2.27 | 2.25 | 2.20 | 2.33 | 2.41 |
| | 75 | 2.25 | 2.29 | 2.19 | 2.32 | 2.37 |

TABLE 5

| | Temperature (° C.) | TT | FF | FS | SF | SS |
|---|---|---|---|---|---|---|
| Reset voltage RST (V) | −40 | 2.33 | 2.28 | 2.27 | 2.39 | 2.48 |
| | 15 | 2.30 | 2.30 | 2.23 | 2.36 | 2.43 |
| | 75 | 2.30 | 2.35 | 2.23 | 2.37 | 2.41 |

In view of the entire tolerance rate, the conventional reset circuit PA1 would reach the percentage around 5.81%, while the first embodiment of the power on and power down reset circuit 1 reaches the percentage around 5.31%, i.e., a smaller tolerance rate. The entire tolerance rate is derived by having the difference of the maximum voltage value and the minimum voltage value to be divided by the sum of the maximum voltage value and the minimum voltage value. In Table 4 (for the convention art), the maximum voltage value is 2.46, while the minimum voltage value is 2.19. On the other hand, in Table 5 (for the first embodiment of the power on and power down reset circuit 1), the maximum voltage value is 2.48, while the minimum voltage value is 2.23.

Thus, from the foregoing experimental analysis, it is proved that the first embodiment of the power on and power down reset circuit 1 provided by this invention is superior to the conventional reset circuit PA1 in achieving the power saving and lowering the entire tolerance rate of the reset voltage RST.

Figure 4:
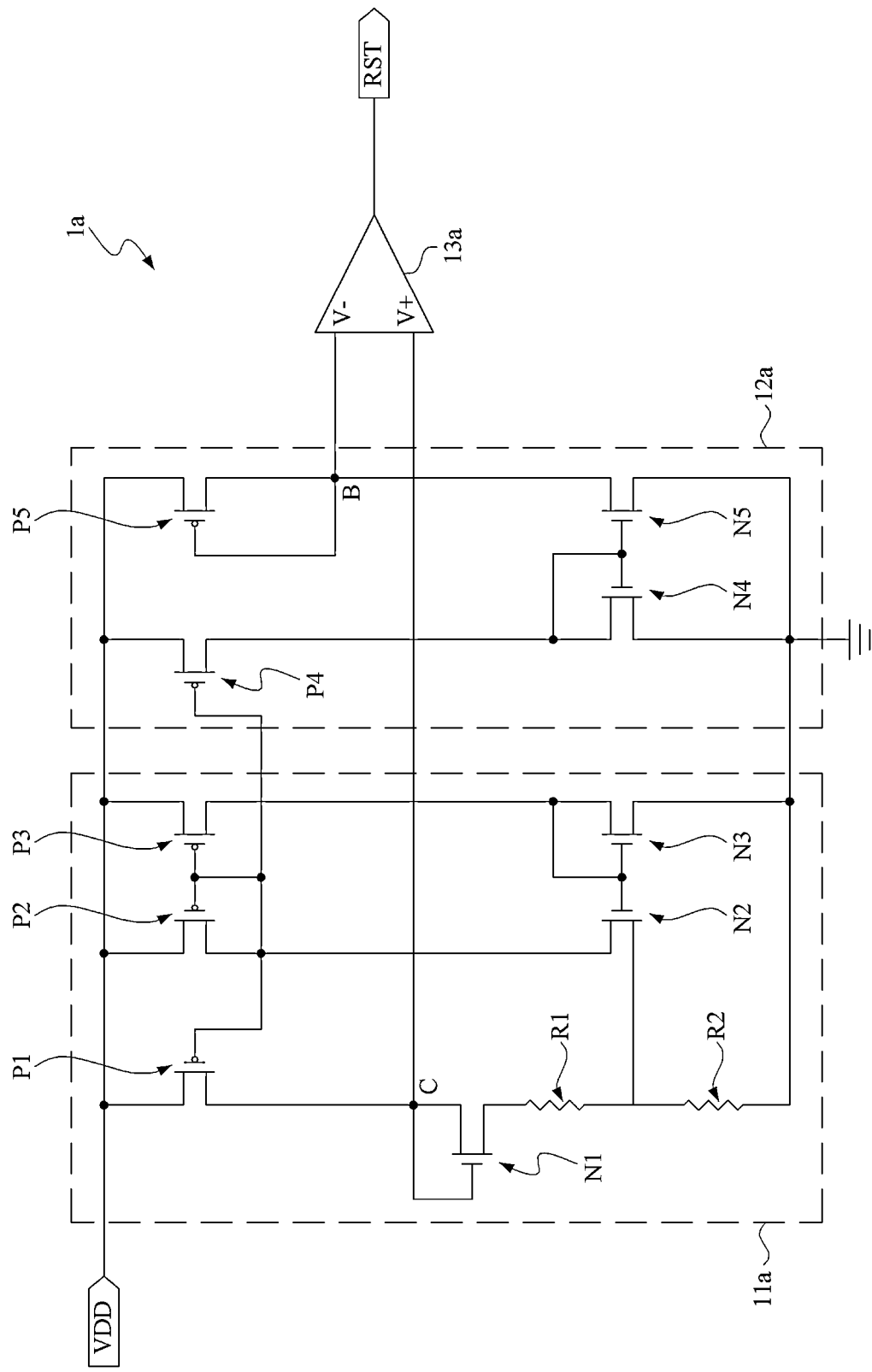
FIG. 4 is a schematic view of a second embodiment of the power on and power down reset circuit in accordance with the present invention.

Finally, referring to FIG. 4, a second embodiment of the power on and power down rest circuit is schematically shown. In this embodiment, the power on and power down reset circuit 1a, configured for receiving an input voltage VDD outputted by an input-voltage end to further generate a corresponding reset voltage RST, includes a reference voltage generation module 11a, a monitoring voltage generation module 12a and a comparator 13a.

The major difference between the power on and power down reset circuit 1a of the second embodiment and the power on and power down reset circuit 1 of the aforesaid first embodiment is at the position of the node for generating the reference voltage in the reference voltage generation module. Except for that, in these two embodiments, circuit components in the reference voltage generation modules 11, 11a, the voltage generation modules 12, 12a, or the comparators 13, 13a are the same, and thus details thereabout would be omitted herein.

In this embodiment, a node C is formed by the first drain of the first PMOS transistor P1, the sixth gate of the first NMOS transistor N1, and the sixth drain of the first NMOS transistor N1, and the node C is further serially connected to the comparator 13a for generating a reference voltage to the second voltage-input end V+. In this embodiment, the first PMOS transistor P1, the first NMOS transistor N1, the first resistor R1 and the second resistor R2 are also integrated to perform the temperature compensation. Accordingly, though the reference voltage at the node C of this embodiment is different to that at the node A of the aforesaid first embodiment, yet each of both is still superior to the conventional reset circuit PA1 in achieving the power saving and lowering the entire tolerance rate of the reset voltage RST.

In summary, the power on and power down reset circuit provided in this invention utilizes the first PMOS transistor, the first NMOS transistor, the first resistor and the second resistor are integrated to perform the temperature compensation. Thus, in comparison with the prior art, based on experimental data, the power on and power down reset circuit of this invention can perform much better in achieving the power saving and lowering the entire tolerance rate of the reset voltage RST.

While the present invention has been particularly shown and described with reference to a preferred embodiment, it will be understood by those skilled in the art that various changes in form and detail may be without departing from the spirit and scope of the present invention.

What is claimed is:

1. A power on and power down reset circuit, applied for receiving an input voltage input from an input-voltage end to further generate a reset voltage, comprising:
  a reference voltage generation module, electrically connected with the input-voltage end, configured for receiving the input voltage to generate correspondingly a reference voltage, including:
    a first PMOS transistor, having a first source, a first drain and a first gate, the first source being to receive the input voltage;
    a second PMOS transistor, having a second source, a second drain and a second gate, the second drain being electrically serially connected with the first gate of the first PMOS transistor, the second source being to receive the input voltage;
    a third PMOS transistor, having a third source, a third drain and a third gate, the third gate being electrically serially connected with the second gate, the third source being to receive the input voltage;
    a first NMOS transistor, having a sixth source, a sixth drain and a sixth gate, the sixth drain being electrically serially connected with the first drain of the first PMOS transistor, the sixth gate being electrically serially connected with the first drain;
    a second NMOS transistor, having a seventh source, a seventh drain and a seventh gate, the seventh drain being electrically serially connected with the second drain;
    a third NMOS transistor, having an eighth source, an eighth drain and an eighth gate, the eighth gate being electrically serially connected with the seventh gate, the eighth drain being electrically serially connected with the third drain;
    a first resistor, electrically serially connected with the sixth source of the first NMOS transistor and the seventh drain of the second NMOS transistor; and
    a second resistor, electrically serially connected with the first resistor;
  a monitoring voltage generation module, electrically connected with the input-voltage end, configured for receiving the input voltage to generate correspondingly a monitoring voltage; and
  a comparator, having a first voltage-input end and a second voltage-input end, electrically connected with the reference voltage generation module and the monitoring voltage generation module, being to receive the monitoring voltage and the reference voltage for generating accordingly the reset voltage.

2. The power on and power down reset circuit of claim 1, wherein the monitoring voltage generation module includes:
  a fourth PMOS transistor, having a fourth source, a fourth drain and a fourth gate, the fourth source being to receive the input voltage;
  a fifth PMOS transistor, having a fifth source, a fifth drain and a fifth gate;
  a fourth NMOS transistor, having a ninth source, a ninth drain and a ninth gate, the ninth drain being electrically serially connected with the fourth drain; and
  a fifth NMOS transistor, having a tenth source, a tenth drain and a tenth gate, the tenth gate being electrically serially connected with the ninth gate, the tenth drain being electrically serially connected with the fifth drain.

3. The power on and power down reset circuit of claim 1, wherein the third drain of the third PMOS transistor is electrically connected to the eighth drain of the third NMOS transistor to form a node in between, and the node is further serially connected with the comparator for generating the reference voltage.

4. The power on and power down reset circuit of claim 1, wherein the first drain of the first PMOS transistor, the sixth drain of the first NMOS transistor, and the sixth source of the first NMOS transistor are electrically connected to form a node, and the node is serially connected with the comparator for generating accordingly the reference voltage.

5. The power on and power down reset circuit of claim 1, wherein, when the monitoring voltage is greater than the reference voltage, the reset voltage generated at the comparator is 0.

6. The power on and power down reset circuit of claim 1, wherein, when the monitoring voltage is less than the reference voltage, the reset voltage generated at the comparator is equal to the input voltage.

* * * * *